SEMICONDUCTOR REACTANCE CIRCUIT

Filed Aug. 23, 1950 2 Sheets-Sheet 1

INVENTOR
HUNTER C. GOODRICH, JR.
BY H. O. Newton
ATTORNEY

INVENTOR
HUNTER C. GOODRICH, JR.
BY H. L. Newton
ATTORNEY

Patented Oct. 9, 1951

2,570,939

UNITED STATES PATENT OFFICE 2,570,939

SEMICONDUCTOR REACTANCE CIRCUIT

Hunter C. Goodrich, Jr., Collingswood, N. J., assignor to Radio Corporation of America, a corporation of Delaware Application August 23, 1950, Serial No. 181,073

13 Claims. (Cl. 332—29)

This invention relates generally to variable reactance circuits, and more particularly relates to a variable reactance circuit embodying a semiconductor device.

Semi-conductor devices are known which may be used in an amplifier, oscillator or modulator circuit. Such a device which is usually called a transistor may include a semi-conducting body and at least three electrodes called the base, emitter and collector electrodes which are in contact with the body. The semi-conducting body may, for example, consist of a crystal of silicon or germanium. The base electrode is in low-resistance contact with the crystal to control the potential of the bulk of the crystal. The base electrode may, for example, consist of a piece of suitable metal such as brass soldered to the crystal. The emitter and base electrodes are in rectifying contact with the crystal and may, for example, consist of fine pointed wires which are in small-area contact with the crystal. It is also feasible to provide line contacts which may be used as emitter and collector. For operation as an amplifier the emitter is biased in the forward direction and the collector in the reverse direction with respect to the base. If the crystal is of the N type, the emitter should be positive and the collector negative with respect to the base. If the crystal is of the P type, the potentials must be reversed.

It is well known that a reactance may be simulated by means of a vacuum tube and associated circuit elements. Such a reactance tube circuit requires usually a tube of the pentode type and additional circuit elements such as a capacitor and a resistor which are utilized as a phase splitting network. Accordingly, such reactance tube circuits are comparatively complicated, and the variation of the frequency of a resonant circuit which may be obtained with such a simulated reactance is comparatively small.

A copending application to Goodrich, filed on June 24, 1950, Serial No. 170,088, entitled "Variable Reactance Transistor Circuit" and assigned to the assignee of this application discloses a reactance circuit which utilizes a semi-conductor device or transistor. In that circuit use is made of the transit time of the charge carriers flowing between emitter and collector. Accordingly, a reactance appears, for example, between the collector and base electrodes, the magnitude of which may be varied by controlling the voltage supplied to the device. This variable reactance may be utilized for varying the frequency of a resonant circuit. Since this previously disclosed circuit depends on the transit time of the charge carriers it will work best at comparatively high frequencies and the reactance change obtained in this manner will be small at low frequencies. Furthermore, the resistive impedance of the semiconductor device will load down the resonant circuit connected thereto, thereby to lower its Q.

It is an object of the present invention, therefore, to provide an improved reactance circuit which may be used for controlling or modulating the frequency of the wave developed by an oscillator circuit or for electrically tuning an amplifier circuit or for controlling its band width, the reactance circuit consisting essentially of a resonant circuit and a semi-conductor device.

A further object of the invention is to provide a simple reactance circuit including a semi-conductor device which requires fewer circuit elements than conventional reactance tube circuits and by means of which large variations in reactance may be obtained.

Another object of the invention is to provide an improved semi-conductor reactance circuit which does not depend for its operation on the transit time of the charge carriers of a semi-conductor device, which will operate at low as well as at high frequencies and which provides a small resistive loading of a resonant circuit to be controlled or modulated.

Still a further object of the invention is to provide a reactance circuit of the type referred to wherein provision is made to correct or compensate for the phase shift between the input and output currents and also for a resulting negative resistance which may cause undesired oscillations.

A variable reactance system in accordance with the present invention comprises a resonant circuit and a semi-conductor device of the type referred to. One terminal of the inductor and one terminal of the capacitor of the resonant circuit are connected together. The other two terminals are connected to the emitter electrode and to the base electrode respectively of the semi-conductor device. Furthermore, the collector electrode is coupled to either the inductor or to the capacitor of the resonant circuit and preferably to an intermediate point thereof.

Thus, the emitter-to-base impedance is connected in series between the inductor and capacitor of the resonant circuit while the collector-to-base impedance is connected in shunt with one of the reactances of the resonant circuit or with a portion thereof. As a result the emitter current is approximately in phase quadrature with the voltage across the reactance element which is coupled to the collector. If the phase shift within the semi-conductor device can be neglected, the collector current is also in phase quadrature with the collector voltage. The semi-conductor device accordingly appears as a reactance which shunts the reactance element coupled to the collector. A variation of the emitter bias voltage will vary the magnitude of this simulated reactance.

It is also feasible to connect a phase shifting network in circuit with the emitter and preferably between emitter and collector. In this manner, the phase of the emitter current with respect to the collector current may be shifted so that the collector voltage is substantially in phase quadrature with the collector current even if there should be a phase shift within the device.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1:
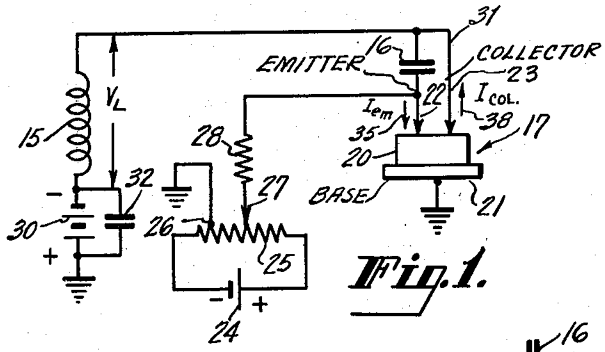
Figure 1 is a schematic circuit diagram of a variable reactance system embodying the present invention.

Referring now to the drawings, in which like components have been designated by the same reference numerals throughout the figures, and particularly to Figure 1, there is illustrated in Figure 1 a variable reactance system which includes a parallel resonant circuit having an inductor 15 and a capacitor 16, one terminal of each of which is connected together. The reactance circuit further comprises a semi-conductor device generally indicated at 17. The device 17 includes a semi-conducting body 20 which may, for example, consist of a crystal of silicon or germanium which preferably is of the N type although it may be of the P type. The surface of crystal 20 may be polished and etched as is conventional.

Base electrode 21, emitter electrode 22 and collector electrode 23 are in contact with crystal 20. Base electrode 20 may be grounded as shown. A variable voltage in the forward direction is impressed between emitter 22 and base 21. To this end there may be provided a suitable source of voltage such as battery 24 across which a resistor 25 is connected. A tap 26 on resistor 25 may be grounded as shown while a variable tap 27 is connected to emitter 22 through emitter resistor 28, the purpose of which will be explained hereinafter.

In accordance with the present invention, capacitor 16 is connected to emitter 22. Inductor 15 is connected to grounded base electrode 21 through a suitable source of voltage such as battery 30 having its positive terminal grounded. The negative terminal of battery 30 is connected through inductor 15 and lead 31 to collector 23. Accordingly, a bias voltage in the reverse direction is impressed between collector 23 and base 21. Battery 30 may be shunted for signal frequency currents by bypass capacitor 32.

The circuit of Figure 1 will function as a reactance circuit. Thus, the impedance existing between emitter 22 and base 21 is connected in series between capacitor 16 and inductor 15. Furthermore, the impedance between collector 23 and base 21 is connected in shunt with inductor 15. The thus resulting equivalent circuit is shown in Figure 2 where resistor 33 indicates the equivalent resistance between emitter 22 and base 21 while variable inductor 34 indicates the impedance which appears as a reactance and which exists between collector 23 and base 21.

Figures 3, 4:
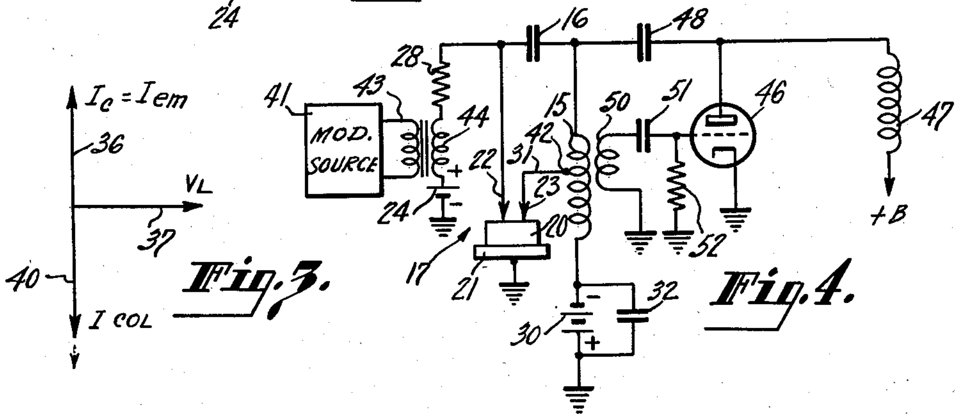
Figure 3 is a vector diagram illustrating schematically the reactive currents and voltage of the circuit of Figure 1.
Figure 4 is a circuit diagram of a reactive circuit, in accordance with the invention, coupled to an oscillator circuit, the semi-conductor device of the circuit representing a variable inductance.

The operation of the circuit of Figure 1 will best be understood by reference to Figure 3. The emitter current $I_{em}$ indicated by arrow 35 in Figure 1 is shown by vector 36 in Figure 3. This current equals the current $I_c$ which is the current flowing through capacitor 16. Accordingly, the emitter current $I_{em}$ is 90 degrees out of phase with respect to the voltage $V_L$ indicated in Figure 1 and represented by vector 37 in Figure 3 which is the voltage across inductor 15. At the same time, the collector current $I_{col}$ indicated by arrow 38 in Figure 1 and vector 40 in Figure 3 will be 90 degrees out of phase with respect to the collector voltage $V_{col}$. However, this is only true if the phase shift of the emitter and collector currents $I_{em}$ and $I_{col}$ within device 17 is negligible.

Figure 2:
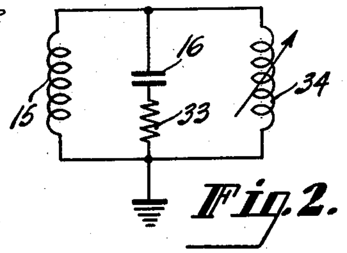
Figure 2 is an equivalent circuit diagram of the reactance circuit of Figure 1.

It will accordingly be seen that device 17 simulates a reactance and particularly an inductance shunting inductor 15 as illustrated in Figure 2 at 34. The magnitude of inductance 34 depends on the emitter bias voltage which is variable by tap 27. This will control the gain of device 17 and accordingly the magnitude of the collector current $I_{col}$ as indicated by the dotted portion of vector 40.

The magnitude of emitter resistor 28 determines the variation of inductance 34 as well as the Q of parallel resonant circuit 15, 16. Emitter resistor 28 actually shunts resistor 33 which represents the equivalent resistance between emitter 22 and base 21. Only the equivalent emitter resistance 33 varies while the magnitude of resistor 28 remains constant. Accordingly, if the resistance of resistor 28 is larger than the equivalent emitter resistance 33, the reactive effect of the circuit is large but the resulting resistive load of the resonant circuit 15, 16 is large resulting in a low Q of the resonant circuit. On the other hand, if the external resistor 28 is smaller than the equivalent emitter resistance 33, the reactive effect of the circuit is reduced and the reduction of the Q of resonant circuit 15, 16 is also smaller. This will be obvious because the current through the external resistor 28 does not contribute to the variation of the reactive effect.

Referring now to Figure 4 there is illustrated a combined reactance and oscillator circuit in accordance with the invention. Capacitor 16 is again connected to emitter 22. Collector 23 is connected by conductor 31 to a tap 42 on inductor 15. Accordingly, only a portion of inductor 15 is connected between collector 23 and base 21 which will facilitate matching of the impedance which appears looking into the electrodes of device 17 to that of the parallel resonant circuit. Instead of tapping inductor 15 it is also feasible to tap capacitor 16.

A modulation signal developed by source 41 may be impressed on primary coil 43 which is coupled to secondary coil 44 connected in the emitter circuit. The modulation signal developed by source 41 will accordingly modulate the emitter voltage thereby to modulate the reactive effect of the circuit of Figure 4.

The above described reactance circuit is coupled to an oscillator circuit including a vacuum tube 46 having its cathode grounded as shown. Its plate is supplied with a suitable anode voltage indicated at +B through choke coil 47. The plate of tube 46 is coupled to inductor 15 through blocking capacitor 48. The grid circuit of tube 46 includes inductor 50 coupled to inductor 15 and having one terminal grounded while its other terminal is coupled to the control grid by blocking capacitor 51. A grid leak resistor 52 is connected between the control grid and ground.

Figures 5, 6:
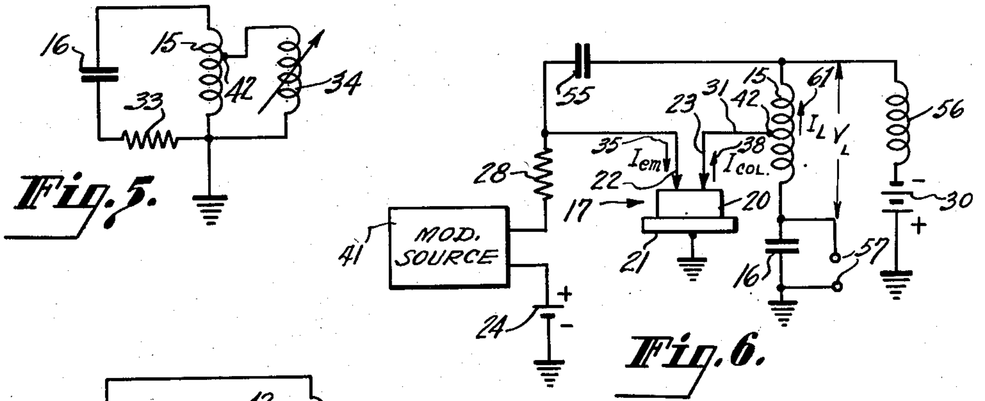
Figure 5 is an equivalent circuit diagram of the reactance circuit of Figure 4.
Figure 6 is a circuit diagram of a reactance circuit wherein the semi-conductor device appears as a variable capacitance and embodying the present invention.

The oscillator circuit just described has a tuned plate circuit 15, 16 which is coupled to the grid-cathode circuit by inductor 50 and operates in a conventional manner. Figure 5 illustrates the equivalent circuit of the reactance circuit of Figure 4. The main difference between the equivalent circuits of Figures 2 and 5 is that variable inductance 34 is connected across a portion of inductor 15 only. In view of the previous description, no further explanation of the operation of the circuit of Figure 4 is believed to be necessary.

By way of example in the circuit of Figure 4, capacitor 16 may have a capacitance of 100 mmf. (micromicrofarads), and the normal resonant frequency of resonant circuit 15, 16 may be 1,000 kc. (kilocycles). The resistance of resistor 28 may be 82 ohms. When the emitter current increases from a very low value to about 0.6 ma. (milliamperes) the frequency of resonant circuit 15, 16 is increased to 1100 kc. The variation of the frequency of circuit 15, 16 accordingly amounts to 10 per cent which is a very high modulation value. The permissible frequency deviation of a standard frequency modulation broadcast wave amounts to approximately ±0.1 per cent.

Another modification of the reactance circuit of the invention is illustrated in Figure 6. Instead of connecting capacitor 16 to emitter 22 it is also feasible, as shown in Figure 6, to connect inductor 15 to emitter 22. In that case, a blocking capacitor 55 is connected between one terminal of inductor 15 and emitter 22. The emitter bias voltage is supplied through battery 24, modulation source 41 and emitter resistor 28. The collector electrode is also supplied with a suitable voltage through a shunt circuit including battery 30 and choke coil 56 which in turn is connected to collector 23 through a portion of inductor 15, tap 42 and lead 31. A suitable output wave may be derived from output terminals 57 connected across capacitor 16 which has one terminal grounded.

Figure 7:
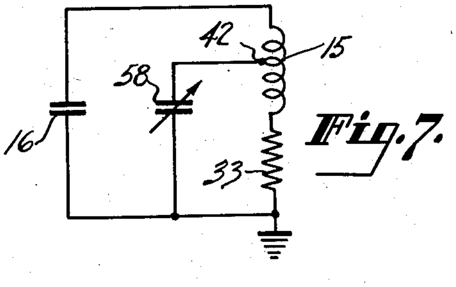
Figure 7 is an equivalent circuit diagram of the reactance circuit of Figure 6.

The equivalent circuit of the reactance circuit of Figure 6 is shown in Figure 7. The parallel resonant circuit again includes capacitor 16 and inductor 15 which are connected together through resistor 33 representing the impedance between emitter 22 and base 21. Capacitor 58 indicates the simulated capacitance effect of device 17 which is connected between tap 42 on inductor 15 and ground as shown.

Figure 8:
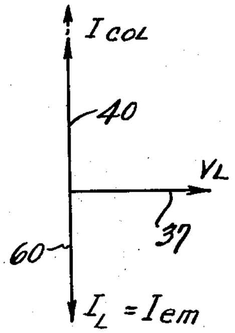
Figure 8 is a vector diagram illustrating schematically the reactive currents and voltage of the circuit of Figure 6.

The vector diagram of the circuit of Figure 6 is shown in Figure 8. The voltage $V_L$ which is the voltage across inductor 15 is indicated by vector 37. This voltage is again approximately 90 degrees out of phase with the emitter current $I_{em}$ indicated by vector 60, the emitter current being shown by arrow 35 in Figure 6. The emitter current is the same as the current $I_L$ which is the current through inductor 15 indicated by arrow 61 in Figure 6. The collector current $I_{col}$ indicated by vector 40 in Figure 8 is also approximately 90 degrees out of phase with respect to $V_L$.

As clearly shown by the vector diagram of Figure 8 the device 17 now simulates a capacitance which varies with the modulation signal impressed on emitter 22. This is clearly shown by variable capacitor 58 in Figure 7. It will be obvious that this is due to the fact that inductor 15 is now connected to emitter 22 instead of capacitor 16.

Figure 9:
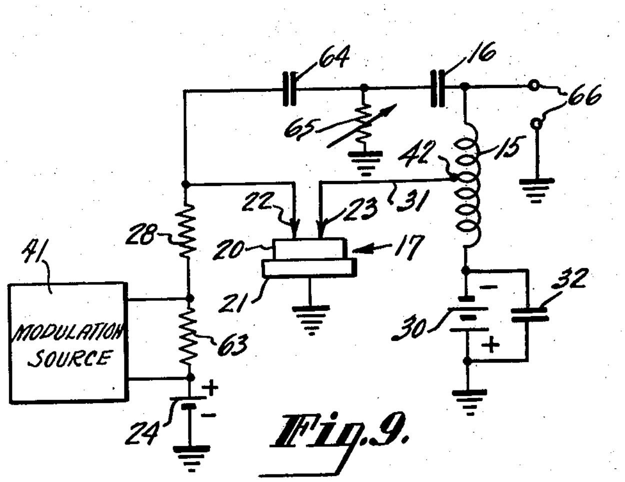
Figure 9 is a circuit diagram of another variable reactance circuit, in accordance with the invention, including means for shifting the phase of the emitter current with respect to the collector current.

The circuit of Figure 9 to which reference is now made, is essentially similar to that of Figure 4 except that a phase shift network has been connected in circuit with emitter 22. The modulation signal developed by source 41 may be impressed across resistor 63 serially connected between battery 24 and emitter resistor 28. Collector 23 is again connected by lead 31 to tap 42 on inductor 15. Capacitor 16 is coupled to emitter 22 through capacitor 64, and the junction point of capacitors 16, 64 is grounded through variable resistor 65. Capacitor 64 and variable resistor 65 form a phase shifting network which is effectively connected between emitter 22 and collector 23. An output signal may be obtained from output terminals 66, one of which is grounded while the other one is connected to the junction point between inductor 15 and capacitor 16.

Figures 10, 11:
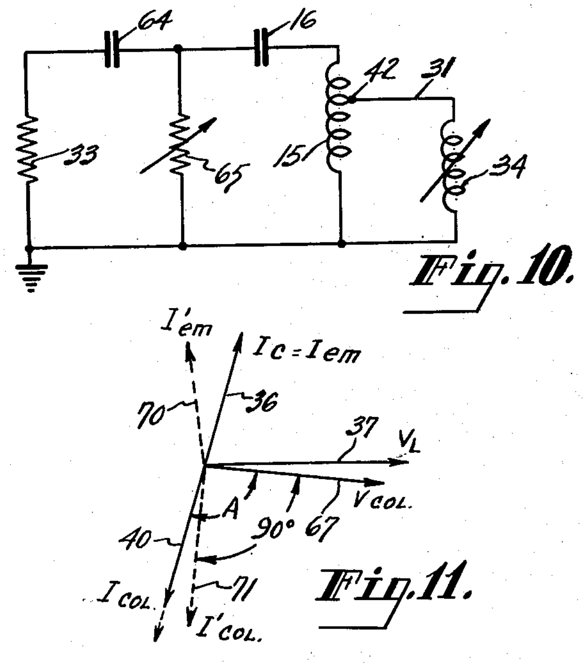
Figure 10 is an equivalent circuit diagram of the reactance circuit of Figure 9.
Figure 11 is a vector diagram illustrating the reactive currents and voltages existing in the circuit of Figure 9 with and without its phase shifting network.

The equivalent circuit of the reactance circuit of Figure 9 is shown in Figure 10. A portion of inductor 15 between tap 42 and ground is shunted by variable inductor 34 illustrating the reactance effect of the device 17. Capacitor 64 is connected in series with resistor 33 which is the equivalent emitter resistance. Variable resistor 65 shunts capacitor 64 and resistor 33. The parallel resonant circuit consists essentially of inductor 15 and capacitor 16. The capacitance of capacitor 64 has little effect on the resonant frequency of the parallel resonant circuit.

The vector diagram of Figure 11 illustrates the currents and voltages of the reactance circuit of Figure 9 with and without phase shifting network 64, 65. The emitter current $I_{em}$ is again indicated by vector 36. This vector also represents the current $I_c$ which is the current through capacitor 16. The collector current $I_{col}$ is indicated by vector 40 and is assumed to be in phase opposition with $I_{em}$. Vector 37 indicates the voltage $V_L$ which is developed across inductor 15. Vector 67 indicates the voltage $V_{col}$ which is the voltage applied to collector 23. It will be noted that the phase angle A between $V_{col}$ and $I_{col}$ is larger than 90 degrees. Furthermore, vectors 36 and 37 indicating $I_{em}$ and $V_L$ are less than 90 degrees out of phase because the emitter resistance 33 is in series with capacitor 16. The fact that vectors 37 and 67 indicating $V_L$ and $V_{col}$ are not in phase is due to the internal collector resistance which would be in shunt with inductor 34 (Figure 10). In order to obtain a pure reactive effect the angle A between vectors 67 and 40 should be exactly 90 degrees.

In accordance with the present invention, this angle may be made 90 degrees by means of phase shift network 64, 65. Preferably, resistor 65 is adjustable to adjust the amount of the phase shift. The effect of this phase shift network is to shift the phase of the emitter current $I'_{em}$ as shown by vector 70 in Figure 11 with respect to the collector current. This will also cause a shift of the phase of the collector current $I'_{col}$ shown by vector 71 in such a direction that the phase angle between vectors 67 and 71 becomes 90 degrees as shown in Figure 11. Accordingly, the device of Figure 9 represents a pure reactance and particularly a pure inductance as illustrated in Figure 10 by inductor 34. It will, of course, be understood that the circuits illustrated in Figures 1, 4 and 6 may also be provided with a phase shift network of the type illustrated in Figure 9.

Actually, as long as angle A is larger than 90 degrees, a negative resistance component of the collector current is present. This will, of course, cause a rise of the Q of parallel resonant circuit 15, 16 and this rise will be a function of the applied emitter voltage which in turn controls the magnitude of the collector current. Thus, by providing a phase shift network the negative resistance may be substantially eliminated and thereby the Q of the resonant circuit may be maintained substantially constant. With the circuit of Figure 9 a variation of the resonant circuit 15, 16 from its normal value of 1,000 kc. over 30 kc. has been possible with a simultaneous variation of the Q of the resonant circuit of only 5 per cent.

There has thus been disclosed an improved variable reactance circuit including a semi-conductor device. The device may be connected to simulate either an inductive or a capacitive reactance and the magnitude of the reactance may be varied, controlled or modulated by the emitter voltage. The reactance circuit of the invention may be utilized for controlling or modulating the frequency of the wave developed by an oscillator circuit or for controlling the frequency of the pass band or the band width of an amplifier circuit. The thus obtained frequency variation is comparatively large and the variation of the Q of the resonant circuit may be kept below a predetermined small value. The circuit of the invention is particularly simple and requires essentially a parallel resonant circuit and a semi-conductor device.

What is claimed is:

1. A variable reactance system comprising a resonant circuit having an inductive and a capacitive reactance element, each of said elements having a pair of terminals, a semi-conductor device comprising a semi-conducting body, a base electrode, an emitter electrode and a collector electrode in contact with said body, means for applying a voltage in the reverse direction between said collector and base electrodes and for applying a voltage in the forward direction between said emitter and base electrodes, means connecting one terminal of each of said elements together, means coupling the other terminals of said elements respectively to said emitter and base electrodes, means coupling said collector electrode to one of said reactance elements, and means for varying the voltage applied between said emitter and base electrodes, thereby to vary the frequency of said resonant circuit.

2. A variable reactance system comprising a resonant circuit having an inductive and a capacitive reactance element, each of said elements having a pair of terminals, a semi-conductor device comprising a semi-conducting body, a base electrode, an emitter electrode and a collector electrode in contact with said body, means for applying a voltage in the reverse direction between said collector and base electrodes and for applying a voltage in the forward direction between said emitter and base electrodes, means connecting one terminal of each of said elements together, means coupling the other terminals of said elements respectively to said emitter and base electrodes, means connecting said collector electrode to an intermediate point of one of said reactance elements, and means for varying the voltage applied between said emitter and base electrodes, thereby to vary the frequency of said resonant circuit.

3. A reactance system as defined in claim 1 wherein the other terminal of said capacitive reactance element is connected to said emitter electrode and the other terminal of said inductive reactance element is connected to said base electrode, whereby said device appears as a variable inductance.

4. A reactance system as defined in claim 1 wherein the other terminal of said inductive reactance element is connected to said emitter electrode and the other terminal of said capacitive reactance element is connected to said base electrode, whereby said device appears as a variable capacitance.

5. A reactance system as defined in claim 2 wherein an intermediate point of said inductive reactance element is connected to said collector electrode.

6. A variable reactance system comprising a parallel resonant circuit having an inductive and a capacitive reactance element, each of said elements having a pair of terminals, a semi-conductor device comprising a semi-conducting body, a base electrode, an emitter electrode and a collector electrode in contact with said body, means for applying a voltage in the reverse direction between said collector and base electrodes, means for applying a voltage in the forward direction between said emitter and base electrodes including a source of voltage and a resistor connected serially between said emitter and base electrodes, means connecting one terminal of each of said elements together, means coupling the other terminals of said elements respectively to said emitter and base electrodes, means coupling said collector electrode to one of said reactance elements, and means for varying the forward voltage applied between said emitter and base electrodes, the magnitude of said resistor compared to the magnitude of the normal equivalent resistance which appears between said emitter and base electrodes determining the ratio of the inductive reactance divided by the resistance of said resonant circuit and the frequency elevation of the frequency of said resonant circuit caused by a variation of said forward voltage.

7. A variable reactance system comprising a parallel resonant circuit including a capacitive and an inductive reactance element, each of said elements having a pair of terminals, a semi-conductor device including a semi-conducting body, a base electrode, an emitter electrode and a collector electrode in contact with said body, means for applying a voltage in the forward direction between said emitter and base electrodes and for applying a voltage in the reverse direction between said collector and base electrodes, means for varying the voltage applied in the forward direction between said emitter and base electrodes, a conductor connecting one terminal of said elements together, means connecting the other terminal of said elements respectively to said emitter and base electrodes, means coupling one of said elements to said collector electrode, and a phase shifting network connected in circuit with said emitter electrode for shifting the phase of the emitter current with respect to the collector current so that the voltage at said collector electrode is substantially in phase quadrature with said collector current.

8. A variable reactance system comprising a parallel resonant circuit including a capacitive and an inductive reactance element, each of said elements having a pair of terminals, a semi-conductor device including a semi-conducting body, a base electrode, an emitter electrode and a collector electrode in contact with said body, means for applying a voltage in the forward direction between said emitter and base electrodes and for applying a voltage in the reverse direction between said collector and base electrodes, means for varying the voltage applied in the forward direction between said emitter and base electrodes, a conductor connecting one terminal of said elements together, means connecting the other terminal of said elements respectively to said emitter and base electrodes, means coupling one of said elements to said collector electrode, and an adjustable phase shifting network connected effectively between said emitter and collector electrodes for shifting the phase of the emitter current with respect to the collector current so that the voltage at said collector electrode is substantially in phase quadrature with said collector current.

9. A variable reactance system comprising a parallel resonant circuit including a capacitor and an inductor, each of said elements having a pair of terminals, a semi-conductor device including a semi-conducting body, a base electrode, an emitter electrode and a collector electrode in contact with said body, a first source of voltage connected between said emitter and base electrodes for applying a voltage in the forward direction between said emitter and base electrodes, a second source of voltage mounted between said emitter and base electrodes and one terminal of said inductor for applying a voltage in the reverse direction between said collector and base electrodes, means for varying the voltage applied between said emitter and base electrodes, a conductor connecting one terminal of said capacitor to the other terminal of said inductor, and conductor connecting an intermediate point of said inductor to said collector electrode, and an adjustable phase shifting network connected between said emitter electrode and the other terminal of said capacitor for shifting the phase of the emitter current with respect to the collector current so that the voltage at said collector electrode is substantially in phase quadrature with said collector current.

10. A variable reactance system comprising a resonant circuit including a first capacitor and an inductor connected together, a semi-conductor device comprising a semi-conducting body, a base electrode, an emitter electrode and a collector electrode in contact with said body, said first capacitor being connected to said base electrode, a blocking capacitor connected between said inductor and said emitter electrode, a conductor connecting an intermediate point of said inductor to said collector electrode, means including a first source of voltage connected between said base and emitter electrodes for applying a voltage in the forward direction between said emitter and base electrodes, means including a second source of voltage connected between said base electrode and the junction between said inductor and said blocking capacitor for applying a voltage in the reverse direction between said collector and base electrodes, and means for varying said voltage in the forward direction, thereby to vary the magnitude of the capacitance presented by said device to said resonant circuit.

11. A variable reactance system comprising a resonant circuit including a first capacitor and an inductor connected together, a semi-conductor device comprising a semi-conducting body, a base electrode, an emitter electrode and a collector electrode in contact with said body, said first capacitor being connected to said base electrode, a blocking capacitor connected between said inductor and said emitter electrode, a conductor connecting an intermediate point of said inductor to said collector electrode, means including a first source of voltage connected between said base and emitter electrodes for applying a voltage in the forward direction between said emitter and base electrodes, means including a second source of voltage and a choke coil connected between said base electrode and the junction between said inductor and said blocking capacitor for applying a voltage in the reverse direction between said collector and base electrodes, and means for varying said voltage in the forward direction, thereby to vary the magnitude of the capacitance presented by said device to said resonant circuit.

12. A variable reactance system comprising a resonant circuit including a capacitor and an inductor connected together, a semi-conductor device including a semi-conducting body, a base electrode, an emitter electrode and a collector electrode in contact with said body, said capacitor being connected to said emitter electrode, means including a first source of voltage connected between said base and emitter electrodes for applying a voltage in the forward direction between said emitter and base electrodes, a conductor connecting an intermediate point of said inductor to said collector electrode, means including a second source of voltage connected between said base electrode and said inductor for applying a voltage in the reverse direction between said collector and base electrodes, and means for varying said voltage in the forward direction, thereby to vary the magnitude of the inductance presented by said device to said resonant circuit.

13. A variable reactance system comprising a resonant circuit including a capacitor and an inductor connected together, a semi-conductor device including a semi-conducting body, a base electrode, an emitter electrode and a collector electrode in contact with said body, said capacitor being connected to said emitter electrode, a resistor and a first source of voltage connected between said base and emitter electrodes for applying a voltage in the forward direction between said emitter and base electrodes, a conductor connecting an intermediate point of said inductor to said collector electrode, a second source of voltage connected between said base electrode and said inductor for applying a voltage in the reverse direction between said collector and base electrodes, and means for varying said voltage in the forward direction, thereby to vary the magnitude of the inductance presented by said device to said resonant circuit.

HUNTER C. GOODRICH, Jr.

REFERENCES CITED

The following references are of record in the file of this patent:

UNITED STATES PATENTS

| Number | Name | Date |
|---|---|---|
| 2,486,776 | Barney | Nov. 1, 1949 |
| 2,533,001 | Eberhard | Dec. 5, 1950 |